(12) United States Patent
Steeneken et al.

(10) Patent No.: US 8,818,265 B2
(45) Date of Patent: *Aug. 26, 2014

(54) INTERFACE FOR COMMUNICATION BETWEEN VOLTAGE DOMAINS

(75) Inventors: Peter Gerard Steeneken, Valkenswaard (NL); Maarten Jacobus Swanenberg, Berg en Dal (NL); Henk Boezen, Nijmegen (NL); Gerhard Koops, Aalst (BE); Frans Bontekoe, Nijmegen (NL); Reinout Woltjer, Eindhoven (NL)

(73) Assignee: NXP B.V., Eindhoven (NL)

( * ) Notice: Subject to any disclaimer, the term of this patent is extended or adjusted under 35 U.S.C. 154(b) by 154 days.

This patent is subject to a terminal disclaimer.

(21) Appl. No.: 13/454,815

(22) Filed: Apr. 24, 2012

(65) Prior Publication Data

US 2013/0281033 A1 Oct. 24, 2013

(51) Int. Cl.
*H04B 5/00* (2006.01)
*H01L 21/70* (2006.01)
*H01L 29/00* (2006.01)
*H01L 21/02* (2006.01)
*H03K 17/00* (2006.01)
*H04B 1/44* (2006.01)

(52) U.S. Cl.
CPC . *H04B 1/44* (2013.01); *H03K 17/00* (2013.01)
USPC ............ 455/39; 455/41.1; 257/501; 257/506; 257/532

(58) Field of Classification Search
CPC ........ H04B 5/0012; H04B 5/005; H04B 5/02; H01L 28/40; H01L 29/00; H01L 21/76224; H01L 23/5223; H01L 27/1203; G06K 19/0723
USPC ......... 455/41.1, 333; 257/499–501, 506, 516, 257/532
See application file for complete search history.

(56) References Cited

U.S. PATENT DOCUMENTS

| | | | |
|---|---|---|---|
| 3,273,033 A | 9/1966 | Rossmeisl |
| 4,292,595 A | 9/1981 | Smith |
| 4,748,419 A | 5/1988 | Somerville |
| 5,187,637 A | 2/1993 | Embree |
| 5,321,597 A | 6/1994 | Alacoque |
| 6,347,395 B1 | 2/2002 | Payne et al. |
| 6,636,166 B2 | 10/2003 | Sessions et al. |
| 6,839,862 B2 | 1/2005 | Evoy et al. |
| 6,859,883 B2 | 2/2005 | Svestka et al. |
| 6,882,046 B2 | 4/2005 | Davenport et al. |
| 6,920,576 B2 | 7/2005 | Ehmann |

(Continued)

OTHER PUBLICATIONS

Greg Smith, "Hybrid Isolation Amps Zap Price and Voltage Barriers" Electronic Design, Dec. 11, 1986, pp. 91-?.

(Continued)

*Primary Examiner* — Simon Nguyen

(57) ABSTRACT

One or more embodiments provide circuitry for isolation and communication of signals between circuits operating in different voltage domains using capacitive coupling. The embodiments utilize capacitive structures having increased breakdown voltage in comparison to previous parallel plate implementations. The capacitive isolation is provided by parallel plate capacitive structures, each implemented to have parallel plates of different horizontal sizes. Due to the difference in horizontal size, edges of the parallel plates, where electric fields are the strongest, are laterally offset from the region where the parallel plates overlap. As a result, breakdown voltage between the parallel plates is increased.

20 Claims, 6 Drawing Sheets

(56) References Cited

U.S. PATENT DOCUMENTS

| | | | |
|---|---|---|---|
| 7,302,247 B2 | 11/2007 | Dupuis | |
| 7,376,212 B2 | 5/2008 | Dupuis | |
| 7,421,028 B2 | 9/2008 | Dupuis | |
| 7,447,492 B2 | 11/2008 | Dupuis | |
| 7,460,604 B2 | 12/2008 | Dupuis | |
| 7,577,223 B2 | 8/2009 | Alfano et al. | |
| 7,650,130 B2 | 1/2010 | Dupuis | |
| 7,737,871 B2 | 6/2010 | Leung et al. | |
| 7,738,568 B2 | 6/2010 | Alfano et al. | |
| 7,755,400 B2 | 7/2010 | Jordanger et al. | |
| 7,821,428 B2 | 10/2010 | Leung et al. | |
| 7,856,219 B2 | 12/2010 | Dupuis | |
| 7,902,627 B2 | 3/2011 | Dong et al. | |
| 8,049,573 B2 | 11/2011 | Alfano et al. | |
| 8,064,872 B2 | 11/2011 | Dupuis | |
| 8,188,814 B2 * | 5/2012 | Ng et al. | 333/247 |
| 8,198,951 B2 * | 6/2012 | Dong et al. | 333/12 |
| 2002/0184544 A1 | 12/2002 | Svestka et al. | |
| 2009/0017773 A1 | 1/2009 | Dupuis et al. | |
| 2009/0213914 A1 | 8/2009 | Dong et al. | |
| 2010/0052826 A1 | 3/2010 | Callahan et al. | |
| 2010/0118918 A1 | 5/2010 | Dupuis | |
| 2010/0214716 A1 * | 8/2010 | Liu et al. | 361/290 |
| 2011/0148549 A1 * | 6/2011 | Kanschat et al. | 333/24 R |
| 2013/0001738 A1 * | 1/2013 | Dong | 257/508 |
| 2013/0037909 A1 * | 2/2013 | French et al. | 257/532 |
| 2013/0154071 A1 * | 6/2013 | Haigh et al. | 257/676 |

OTHER PUBLICATIONS

Wally Meinel, et al., "Hermetic Analog Isolation Amplifier", Proceedings of the 1987 International Symposium on Microelectronics, Minneapolis, Sep. 1987.

Burr Brown, Noise Sources in Applications Using Capacitive Coupled Isolated Amplifiers, Application Bulletin, Burr Brown Corporation, 1993.

Burr Brown, Hybrid Isolation Amps Zap Price and Voltage Barriers, Application Bulletin, Burr Brown Corporation, 1994.

Burr Brown, An error analysis of the ISO102 in a small signal measuring application, Application Bulletin, Burr Brown Corporation, 1994.

Burr Brown, ISO 102, ISO 106 Signal Isolation Buffer Amplifiers, Datasheet, Burr Brown Corporation, 1995.

J. Basílio Simoes, et al., "The Optical Coupling of Analog Signals" IEEE Transaction on Nuclear Science, vol. 43, No. 3, Jun. 1996, pp. 1672-1674.

Stephen L. Diamond, "IEEE 1394: Status and growth path", IEEE Micro, Jun. 1996, pp. 75-78.

Thaddeus J. Gabara, et al., "Capacitive coupling and quantized feedback applied to conventional CMOS technology" IEEE Journal of Solid-State Circuits, vol. 32, No. 3, Mar. 1997.

Adrian Paskins, "The IEEE 1394 BUS", The Institution of Electrical Engineers Conference, May 12, 1997.

Richard Crisp, "Direct Rambus Technology: The New Main Memory Standard" IEEE Micro, Nov./Dec. 1997, pp. 18-28.

Thomas Nilsson, "A distributed combined heat and power plant control unit", Master Thesis, Linköping Institute of Technology, Dec. 16, 1997.

Scott Wayne, "Finding the Needle in a Haystack: Measuring Small differential voltages in the presence of large-common mode voltages", Analog Dialogue, 34-1, 2000, pp. 1-4.

Infineon Technologies, IVAX Integrated Voice & ADSL Transceiver, PEB35512, PEB55508, PEB3558, PEB4565, PEB4566, Datasheet, Infineon Technologies AG, 2001.

William B. Kuhn, et al., "An RF-based IEEE 1394 Ground Isolator designed in silicon-on-insulator process" Circuits and Systems, 2001. MWSCAS 2001. Proceedings of the 44th IEEE 2001 Midwest Symposium on ,vol. 2 , Aug. 14-17, 2001.

Scott Irwin, XILINX, "Usage Models for multi-gigabit serial transceivers", WP157, V.1.0, Mar. 15, 2002.

phyCORE-MCF548x Hardware Manual, PHYTEC Technology Holding Company, Jan. 2005.

LANTRONIX, Xpress-DR+Wireless, Datasheet, LANTRONIX, 2006.

Eugenio Culurciello, et al., "Capacitive inter-chip data and power transfer for 3-D VLSI" IEEE Trans. Circuits Syst. II, vol. 53, No. 12, pp. 1348-1352, 2006.

Geoffrey Marcus, et al., "A Monolithic Isolation Amplifier in silicon-on-isolator CMOS: Testing and Applications", Analog Integr. Circ. Sig. Process, Jun. 27, 2006.

* cited by examiner

INTERFACE FOR COMMUNICATION BETWEEN VOLTAGE DOMAINS

Aspects of the present disclosure relate to apparatuses, devices, and methods involving integrated capacitors.

Aspects of the present disclosure relate to the transmission of data between circuits that operate in different voltage domains. For example, circuits may be galvanically isolated using capacitive coupling on signal paths between the circuits. As a result of such isolation, the circuits operate in separate voltage domains that are not referenced to one another by a common ground voltage level. As such, large voltage differences may arise between the corresponding voltage domains. Galvanic isolation has been used for a variety of different applications. For instance, galvanic isolation can be provided between multiple integrated circuit chips, which can be located within the same package or in different packages. Signals can be passed between the integrated circuits using galvanic isolation techniques.

One method of galvanic isolation uses capacitors on signal paths between two circuits as a means of blocking DC voltages and attenuating low-frequency signals while transmitting high-frequency signals. Due to large voltage differences that may arise between isolated voltage domains for some applications, capacitors having high breakdown voltage may be required. However, physical space constraints may make it difficult to implement capacitors having the required breakdown voltage. For example, a parallel plate capacitor may be implemented alongside other circuitry in an integrated circuit (IC) using conventional processes (e.g., CMOS). Two capacitive plates are implemented in different metallization layers of the IC and are separated by a dielectric layer. The breakdown voltage of the parallel plate capacitor is dependent on the thickness of the dielectric layer. For higher voltage applications, the thickness of the dielectric layer is increased to provide a higher breakdown voltage. However, in certain CMOS processes, the maximum dielectric thickness that can be implemented is limited to about 5-10 um. For some applications, this thickness is not sufficient to guarantee sufficient breakdown voltage.

Aspects of the present disclosure relate to the transmission of data between circuits that are isolated from one another. For example, circuits may be galvanically isolated using capacitive coupling on signal paths between the circuits. As a result of such isolation, the circuits operate in separate voltage domains that are not referenced to one another by a common ground voltage level. As such, voltage differences may arise between the corresponding voltage domains. In certain instances, the voltage differences can be relatively large in comparison to the voltages within each of the separate voltage domains.

One or more embodiments provide circuitry for isolation and communication of signals between circuits operating in different voltage domains using capacitive coupling. The embodiments utilize capacitive structures having increased breakdown voltage in comparison to previous parallel plate implementations. The capacitive isolation is provided by parallel plate capacitive structures, each implemented to have parallel plates of different horizontal sizes. Due to the difference in horizontal size, edges of the parallel plates (where electric field is the strongest) are laterally offset so they do not overlap. As a result, breakdown voltage between the parallel plates is increased.

In some particular embodiments, a device for communication between two voltage domains is provided. The device includes a transmitter implemented on a first substrate in a first voltage domain, and a receiver implemented on a second substrate in a second voltage domain. The device includes an isolation circuit configured to provide capacitive isolation for the communication signals between the transmitter and receiver. The isolation circuit includes a first capacitive structure located on the first substrate and a second capacitive structure located on the second substrate. A first plate of the first capacitive structure is configured to receive the communication signals from the transmitter circuit and in the first voltage domain. The second plate of the first capacitive structure is configured as a first floating node of the isolation circuit. A first plate of the second capacitive structure acts as a second floating node of the isolation circuit. The second plate of the second capacitive structure is configured to provide the communication signals to the input of the receiver in the second voltage domain.

In some embodiments, a device for communication between two voltage domains is provided. The device includes a first communication circuit configured to operate in a first voltage domain, and a second communication circuit configured to operate in a second voltage domain. An isolation circuit is configured to provide capacitive isolation for signals communicated between the first and the second communication circuits. The isolation circuit includes a capacitive structure located on a substrate. The capacitive structure includes a first capacitive plate having a first horizontal size. The first capacitive plate is configured to receive the signals from the first communication circuit and in the first voltage domain. The second capacitive plate has a second horizontal size and is parallel to and separated from the first capacitive plate by a dielectric layer. The second capacitive plate is configured to provide the signals to the second communication circuit in the second voltage domain. The second horizontal size differs from the first horizontal size such that the breakdown voltage between the first and second capacitive plates is increased relative to a common horizontal size for the first and second capacitive plates.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims.

Aspects of the present disclosure may be more completely understood in consideration of the detailed description of various embodiments of the present disclosure that follows in connection with the accompanying drawings, in which.

Figure 2:
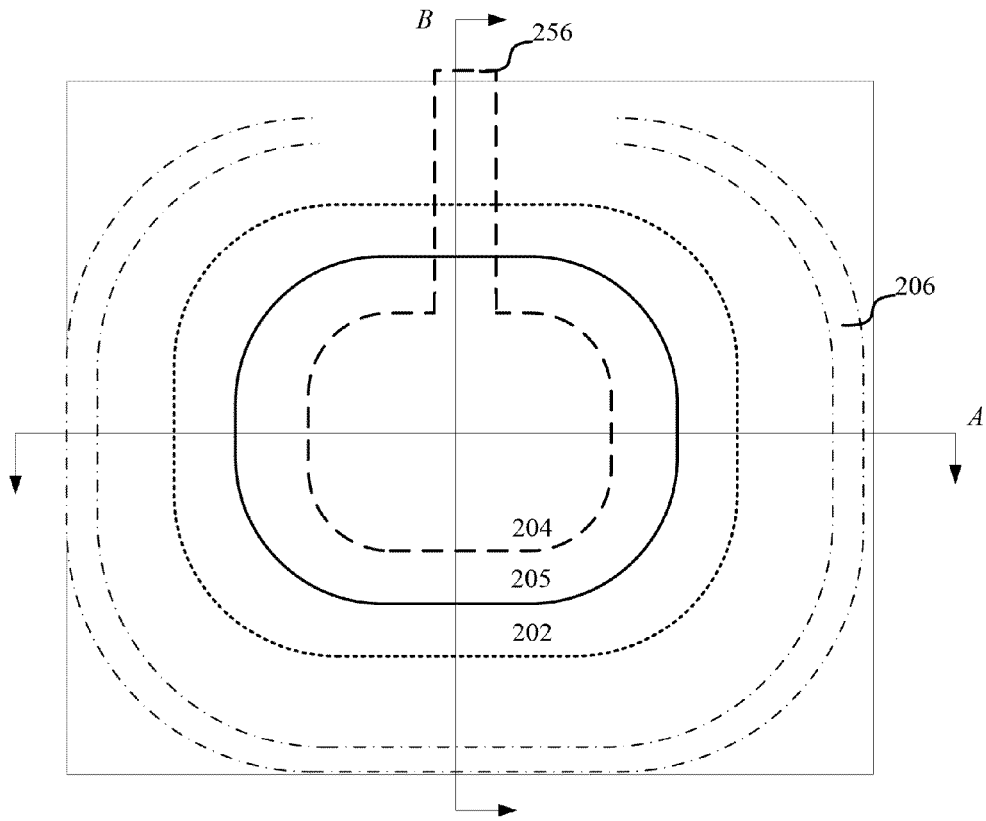
FIG. 2 shows a top view of a high breakdown voltage capacitive structure, consistent with one or more embodiments of the present disclosure.
Figure 6:
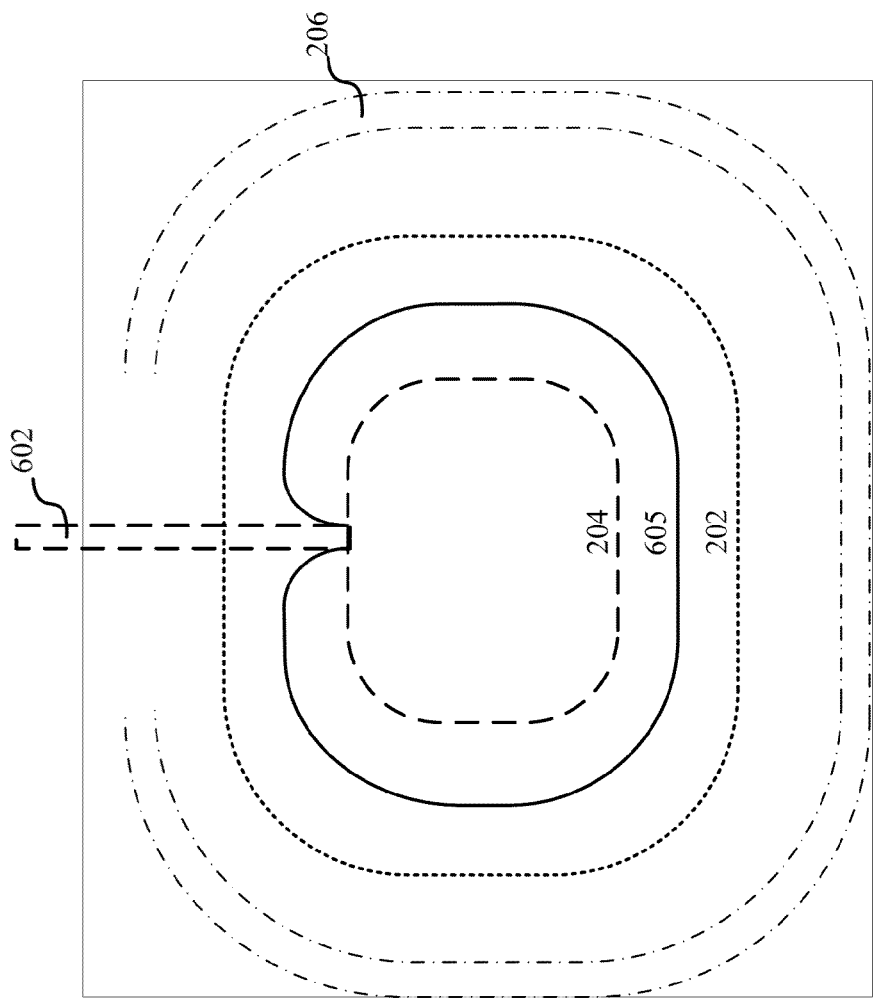
Figure 7:
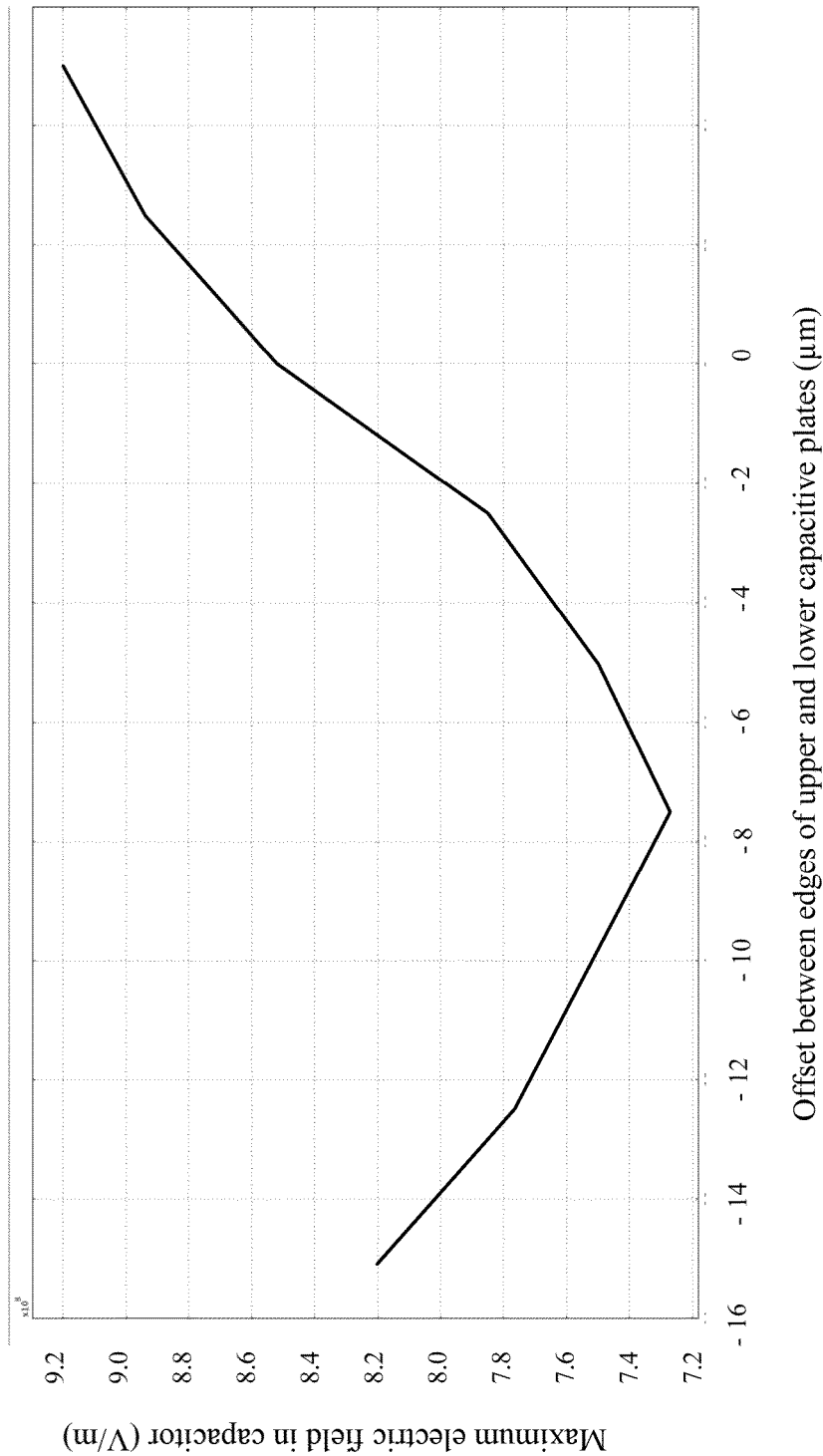

FIG. 6 shows a top view of an alternate configuration of the capacitive structure shown in FIG. 2, consistent with one or more embodiments of the present disclosure; and FIG. 7 shows a graph of electric field of a particular capacitive structure implementation as a function of offset between edges of top and bottom capacitive plates, consistent with one or more embodiments of the present disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims.

Aspects of the present disclosure relate to the transmission of data between circuits that are isolated from one another. For example, circuits may be galvanically isolated using capacitive coupling on signal paths between the circuits. Some particular embodiments use parallel plate capacitor structures to provide capacitive coupling.

It is recognized that sidewalls of the conductive layers formed using CMOS processes may be sloped or slanted. As a result of this slope, there is a sharp corner at the bottom edge of capacitive plates located in the conductive layers. Electric fields produced by electric charge on the capacitive plates are increased at the location of these corners. Even where side walls are vertical, and the corners are 90 degrees, the increase of the electric field may be significant. Also, at the top edge of the capacitive plates, corners can occur, however the field increase at these corners can be smaller since they are less sharp (larger than 90 degrees). Electric fields between parallel plates or next to the edge of the plate are increased, and breakdown voltage is reduced, where a sharp corner of one plate is aligned below or above the other plate. This increase can occur when the corners are aligned and/or one corner of a capacitive plate is aligned with the other capacitive plate).

In one or more embodiments, an isolation circuit is used to provide capacitive coupling for communication between circuits operating in different voltage domains. In some particular embodiments of the present disclosure, capacitive isolation is provided by parallel plate capacitive structures, each implemented to have parallel plates of different horizontal sizes. Due to the difference in horizontal size, edges of the parallel plates (where electric field is the strongest) are laterally offset so they do not overlap. As a result of the offset, breakdown voltage between the parallel plates can be increased. In some implementations, for instance, the parallel plates may be horizontally offset by a distance between the edges of the plates that is between 50% and 200% of the vertical distance between the parallel plates but other offset distances are possible. In some implementations, the first and second capacitive plates of each capacitive structure are centered on a common horizontal position. However, other orientations of the capacitive plates are possible as well including, for instance, capacitive plates that are not centered upon the same vertical line.

In some embodiments, the capacitive plates may be shaped to reduce sharp corners and thus increase breakdown voltage. In some implementations, each capacitive plate is polygon-shaped in a horizontal plane with respective corners that are sufficiently rounded to reduce capacitive breakdown voltages. In some implementations, for instance, corners in the horizontal plane may have a radius of curvature that is between 50% and 400% of the vertical distance between the parallel plates, but smaller radiuses of curvature are possible. In some implementations, top and bottom edges of the sidewalls of the capacitive plates are vertically rounded. In some embodiments, the capacitive structures include a guard ring laterally circumscribing the first and second capacitive plates. The guard ring is vertically located between the first and second capacitive plates and encourages homogeneous lateral field distribution.

In some particular embodiments, an isolation circuit is used to communicate signals between transmitter and receiver circuits operating in different voltage domains over one or more capacitively coupled conductive lines. The isolation circuit includes at least a first one of the capacitive structures located on the same substrate as the transmitter, and at least a second one of the capacitive structures located on the same substrate as the receiver. A first plate of the first capacitive structure is configured to receive the communication signals from the transmitter circuit and in the first voltage domain. The second plate of the first capacitive structure is configured as a first floating node of the isolation circuit. A first plate of the second capacitive structure acts as a second floating node of the isolation circuit. The second plate of the second capacitive structure is configured to provide the communication signals to the input of the receiver in the second voltage domain.

Figure 1:
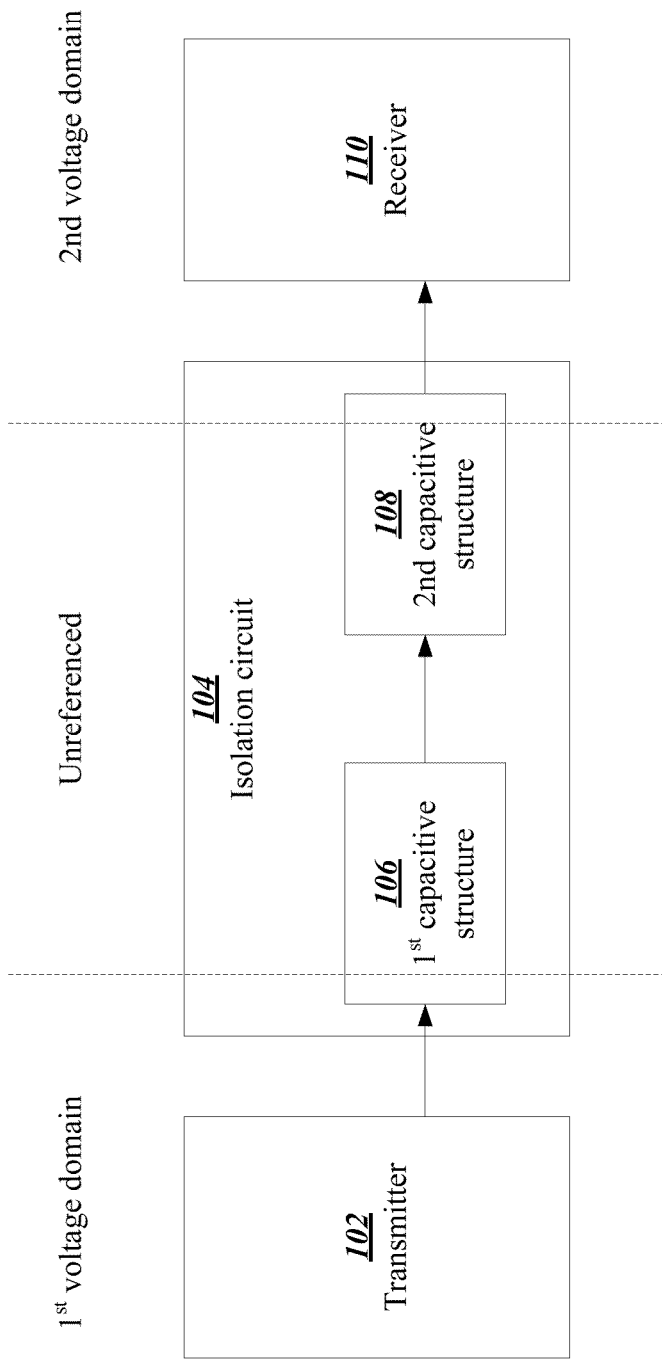
FIG. 1 shows a block diagram of a system for communicating between two isolated voltage domains, consistent with one or more embodiments of the present disclosure.

FIG. 1 shows a system for galvanic isolation between transmitter and receiver circuits operating in different voltage domains. A transmitter circuit 102 operates in a first voltage domain and a receiver circuit 110 operates in a second voltage domain. Isolation circuit 104 provides a communication signal path between the transmitter 102 and receiver 110 while providing galvanic isolation between the two circuits. The isolation circuit 104 includes two capacitive structures 106 and 108.

The isolation circuit 104 is configured to receive data signals from the transmitter 102 that are referenced to a ground voltage of the first voltage domain and provide the data signals to the receiver circuit 110, which references signals to a second ground voltage of the second voltage domain. One capacitive plate of capacitive structure 106 is connected to the transmitter circuit 102 and is located in same voltage domain as the transmitter. Likewise, one capacitive plate of the capacitive structure 108 is connected to the receiver circuit 110 and is located in the same voltage domain as the receiver. Other capacitive plates of the capacitive structures 106 and 108 may be floating voltages that are not referenced to the ground voltage of either voltage domain.

The capacitive structures of the isolation circuit 104 may be implemented on the same or different substrates of the system. For example, the first capacitive structure 106 may be integrated with the transmitter circuit 102 on a first substrate and the second capacitive structure 108 may be integrated with the receiver on a second substrate. In other instances, portions of the capacitive structures can reside on one or more additional substrates. In some other instances, the transmitter circuit 102, receiver circuit 110, and isolation circuit 104 may be located on the same substrate.

It is recognized that communication between transmitter 102 and receiver 110 circuits in different voltage domains, with various communication schemes that utilize different numbers of conductors, is possible. Other embodiments of the isolation circuit can provide additional conductors for communication between the transmitter 102 and receiver 110 circuits. For example, one method of communication over capacitive-coupled conductive lines utilizes one or more pairs of differential signals. Each differential signal pair can include two conductive signal lines.

It is recognized that in some applications the isolation circuit uses other numbers of capacitive structures as well. For instance, in some embodiments, an isolation circuit may be implemented using a single capacitive structure. As described with reference to FIG. 1, the isolation circuit is configured to receive data signals from the transmitter 102 that are referenced to a ground voltage of the first voltage domain and provide the data signals to the receiver circuit 110, which references signals to a second ground voltage of the second voltage domain. One capacitive plate of the capacitive structure is connected to the transmitter circuit 102 and is located in same voltage domain as the transmitter. Likewise, a second capacitive plate of the capacitive structure is connected to the receiver circuit 110 and is located in the same voltage domain as the receiver.

Figure 3:
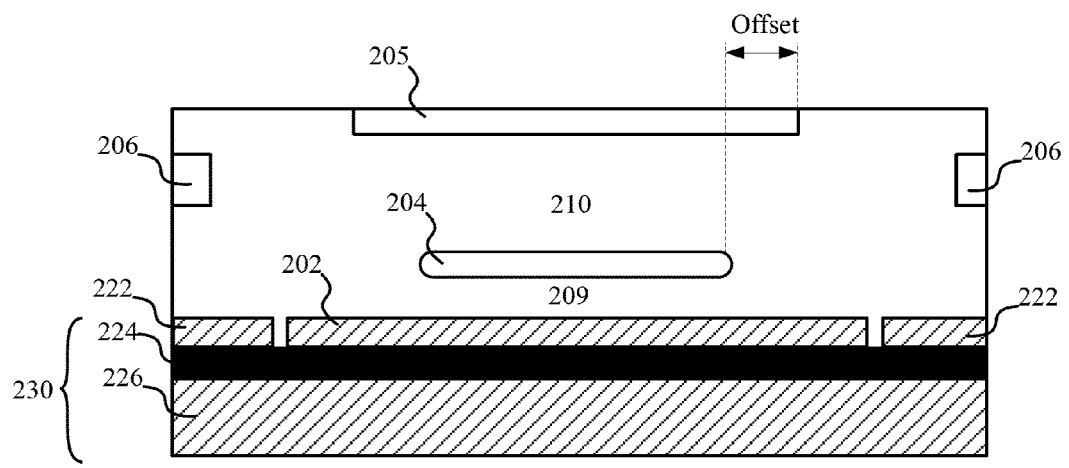
FIG. 3 shows cross-section A of the structure shown in FIG. 2, consistent with one or more embodiments of the present disclosure.

FIG. 2 shows a top view of a capacitive structure formed on a conductive substrate in accordance with one or more embodiments of the present disclosure. FIG. 3 shows a cross-section A of the structure shown in FIG. 2, in accordance with one embodiment. For ease of explanation FIGS. 2 and 3 are discussed together. Although FIG. 2 is a top view of the capacitive structure, elements of lower layers are depicted using dashed lines.

As shown in FIG. 3, the capacitive structure includes a first capacitive plate 204 located in a first metallization layer on a substrate 230. A second capacitive plate 205 is located in a second metallization layer above the first metallization layer. In this example, the first capacitive plate 204 is separated from the substrate by a dielectric layer 209 and capacitive plates 204 and 205 are separated by a dielectric layer 210. It is recognized that other dielectric and or metallization layers may be located above or below the capacitive plates 204 and 205 as well.

As shown in FIGS. 2 and 3 the capacitive plates 204 and 205 have different horizontal sizes to create an offset between the edges of the capacitive plates. The electric field strength between the parallel plates of the capacitor may be nearly constant across the area of the parallel plates except at the edges, where field lines are crowded and lead to an increased electric field. If the corner angle of the edge at the bottom of the top plate is sharper than the corner angle at the top of the bottom plate, the electric field increase at the top plate corner will be larger than the field increase at the top of the bottom plate corner. In this scenario, making the top plate larger will move the top plate corner away from the capacitor region (region where plates overlap) and thus decrease the electric field at this corner. At the same time, an increase of the field at the bottom corner can occur, however, since the corner angle at the top of the bottom plate is smaller, an overall reduction in the maximum electric field will occur. Therefore an increase of the breakdown voltage will occur. In situations where the angle at the bottom plate is sharpest, an increase of the breakdown voltage can be reached by increasing the size of the bottom plate. The highest breakdown voltage may be obtained by making the plate with the sharpest corners at the edges closest to the other plate larger than the other plate by an offset distance. Due to the offset of the edges (where electric field of each plate is the strongest), breakdown voltage between the parallel plates is increased. In this instance, the capacitive plates 204 and 205 are centered on a common horizontal position, where cross-sectional lines A and B intersect. However, other orientations of the capacitive plates are possible as well, such that offset may be different on different edges of the capacitive plates.

In some embodiments, the capacitive plates may be shaped to reduce sharp corners and, thus increase breakdown voltage. For instance, as shown in FIG. 2, capacitive plates 204 and 205 are polygon-shaped in a horizontal plane with horizontally rounded corners at the vertices of the polygon. The rounding of the corners may help to further reduce capacitive breakdown voltages. Similarly, the capacitive plates may have edges that are vertically rounded. For instance, as shown in FIG. 3, capacitive plate 204 has vertically rounded edges whereas edges of capacitive plate 205 are not vertically rounded.

In some embodiments, the capacitive structure includes a guard ring 206 laterally circumscribing the first and second capacitive plates as shown, e.g., in FIGS. 2 and 3. The guard ring is vertically located between the first and second capacitive plates and encourages homogeneous lateral field distribution. The guard ring is kept at a voltage close to the ground voltage that corresponds to the voltage domain of the capacitive structure. In some implementations, the horizontal distance of the guard ring to the capacitor plates is larger than the distance between the parallel capcitive plates 204 and 205.

In some embodiments, the capacitive structure is formed on a silicon-on-insulator (SOI) substrate 230, as shown in FIG. 3. The SOI substrate, includes a handle wafer 226, a silicon layer (222 and 202), and a buried oxide layer 224 providing isolation between the handle wafer and the silicon layer. In various implementations and applications, the handle wafer and/or the silicon layer may be tied to one or more reference voltages (e.g., a ground voltage). In such embodiments, the breakdown voltage may be further improved by isolating a portion of the silicon layer 202 below the capacitive plate 204 such that the portion 202 is a floating voltage and plate 204 is not in close proximity to the ground voltage. The buried oxide layer 224 may also be to provide additional isolation between plate 204 and the handle wafer 226, which may be tied to the ground voltage.

Figure 4:
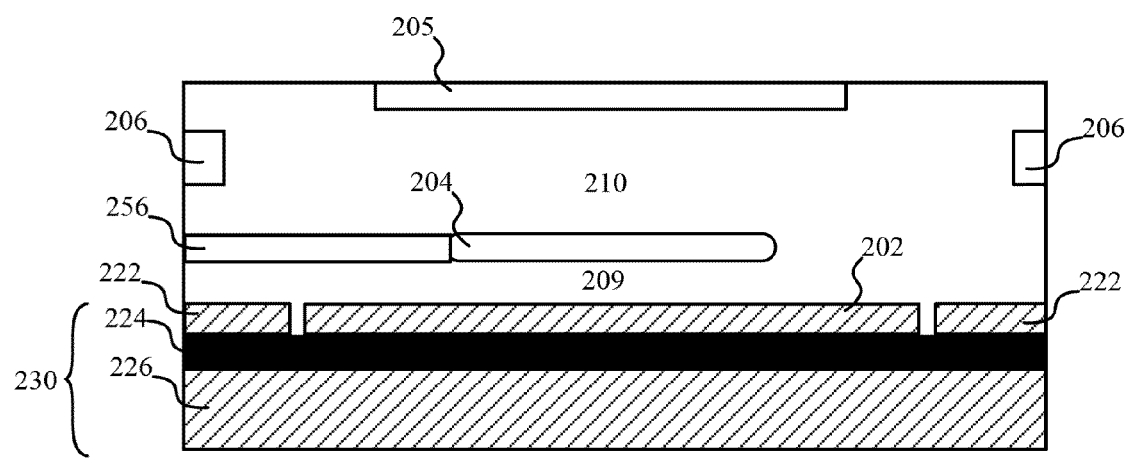
FIG. 4 shows cross-section B of the structure shown in FIG. 2, consistent with one or more embodiments of the present disclosure.

FIG. 4 shows a cross-section B of the structure shown in FIG. 2, in accordance with embodiments of the present disclosure. In this example, a signal line 256, which connects to the lower capacitive plate 204, is located in the same metallization layer as the lower capacitive plate 204.

Figure 5:
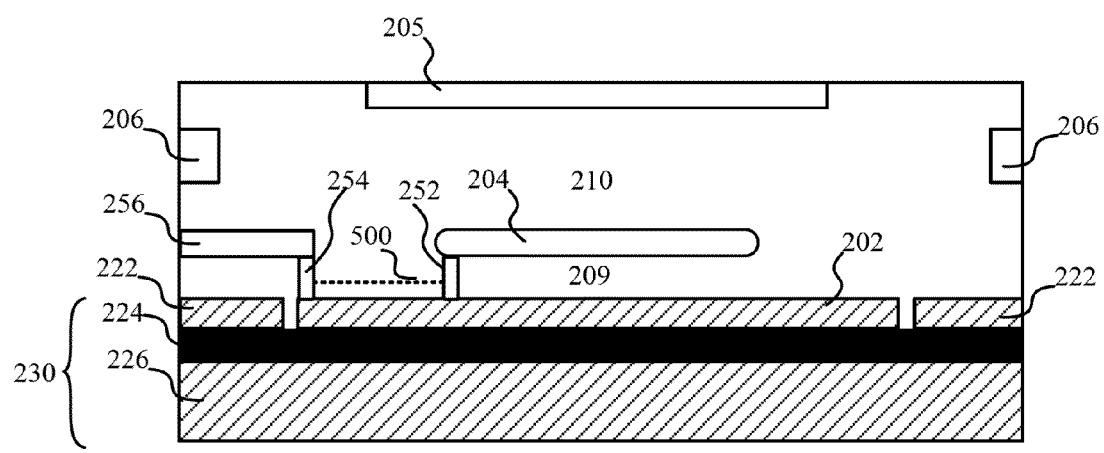
FIG. 5 shows cross-section B of an alternate configuration of the structure shown in FIG. 2, consistent with one or more embodiments of the present disclosure.

As shown in FIG. 4, a signal line connecting to the lower capacitive plate 204 will generally pass below at least one of the edges of the upper plate 205 to connect plate 204 to the transmitter or receiver circuits. In some other embodiments, the signal line may be routed to a lower layer on the substrate to increase distance between the signal line and the edge of the plate. This can be particularly useful for increasing the voltage breakdown of the capacitive device. FIG. 5 shows a cross-section B of the structure shown in FIG. 2 having a signal line routed to a lower layer on the substrate. For instance, as shown in FIG. 5, signal line 256 is connected to the lower plate 204 by vias 252 and 254 and by a portion of the silicon layer 202.

For some applications, it has been discovered that rather than use an SOI silicon layer 202 for the signal line connection, a polysilicon layer can be used. This polysilicon layer can be located in a conducting layer between the lower capacitive plate 204 and the SOI silicon layer 202. In some embodiments, a signal line is provided, with a portion vertically located at a height between the SOI layer 202 and the lower plate. The signal line provides at least part of the electrically conducting path between the transmitter or receiver and the lower capacitive plate. For instance, signal line 256 may be connected to the lower plate 204 by vias 252 and 254 and by a polysilicon line 500, as shown in FIG. 5, located in a metallization layer above SOI silicon layer 202. In this embodiment, the vias 252 and 254 do not need to connect to the portion 202. As explained above, the lower vertical placement of signal line 256 with respect to lower capacitive plate 204, can increase the breakdown voltage for a signal line passing below the edge of an upper capacitive plate 205.

For some applications, use of a polysilicon signal line 500 can configured to have a higher resistance than the rest of the signal line (e.g., 256, 252, and 254). The high-resistance portion 500 will act as a fuse, which will melt in case the breakdown of the capacitor occurs by a voltage higher than the breakdown voltage. For instance, in some applications, such a fuse can be implemented using a rectangular strip of 180 nm thick layer of polysilicon. After melting, the fuse will have a high breakdown voltage that will limit further damage, protecting both equipment and users from the high voltage.

In some other embodiments, the larger plate 205 may have a cut-in shape near the signal line to reduce the electric field in that location. For instance, FIG. 6 shows a top view of an alternative implementation of the structure shown in FIG. 2. For ease of explanation, reference numbers of FIG. 2 are used in FIG. 6 for previously described elements. In this implementation, the upper plate 605 is horizontally cut in toward the lower plate 204 near signal line 602. The signal line has also been narrowed to reduce the electric field generated by the signal line 602.

FIG. 7 shows a graph of electric field of a capacitive structure as a function of offset between edges of top and bottom capacitive plates. The values shown in FIG. 7 correspond to a simulation of a capacitive structure, where edges of the capacitor plates are vertical and have a radius of curvature of 100 nm at the top and bottom plate corners. In this example, where the vertical distance between the capacitor plates was 5 μm, an optimum occurs when the bottom electrode is about 7.5 μm smaller in length and width in the horizontal plane than the top electrode. This is where the maximum electric field is lowest. Other plate edge geometries (e.g., slanted edges or edges with differing radiuses of curvature) may have optimal offset distances that are larger.

In certain instances, one or more embodiments can use different coding techniques and different types of circuits communicating data through the isolation region. The data communications can use analog, digital, RF, serial and/or parallel communication techniques. For certain high-speed applications, different types of modulation schemes can be used for carrying information across the isolation region, including but not limited to OOK (on-off keying), amplitude, phase-based and/or frequency-based. In some instances, communications can be carried out between multiple circuits placed within a single chip-package (e.g., BGA package) and also having galvanic isolation therebetween. The various communications can be carried out using different isolation buffer circuits and amplifiers. Various applications are also contemplated including, but not limited to, applications in which small voltage differences exist between transmitters and receivers and applications in which large voltages can exist (e.g., hundreds of volts as can be used in automotive applications where electric motors are used in place of (or in combination with) combustion engines). Consistent with one or more embodiments discussed herein, U.S. Pat. No. 6,920, 576 (filed May, 31, 2001; Ehmann, Gregory E.), U.S. Pat. No. 6,882,046 (filed Dec. 18, 2001; Davenport, et al.) and "Signal Isolation Buffer Amplifiers" Burr-Brown, ISO102, ISO106, Jan. 1995, each describe useful technical details, applications and various background information, and each of these documents is fully incorporated herein by reference.

The embodiments are thought to be applicable to a variety of applications using galvanic isolation. Other aspects and embodiments will be apparent to those skilled in the art from consideration of the specification. While the present disclosure is amenable to various modifications and alternative forms, specifics thereof have been shown by way of example in the drawings and will be described in further detail. It should be understood that the intention is not to limit the disclosure to the particular embodiments and/or applications described. On the contrary, the intention is to cover all modifications, equivalents, and alternatives falling within the spirit and scope of the present disclosure.

What is claimed is:

1. A device, comprising:
a first substrate in a first voltage domain;
a second substrate in a second voltage domain;
a transmitter circuit, that is in the first voltage domain and that is configured and arranged to transmit communication signals;
a receiver circuit, that is in the second voltage domain, and that has an input that is configured and arranged to receive the communication signals in the second voltage domain;
an isolation circuit configured and arranged to provide capacitive isolation for the communication signals between the first and the second voltage domain, the isolation circuit including
a first capacitive structure located on the first substrate and including,
a first capacitive plate having a first horizontal size and configured and arranged to receive the communication signals from the transmitter circuit and in the first voltage domain, and
a second capacitive plate having a second horizontal size, the second capacitive plate being parallel to and separated from the first capacitive plate by a first dielectric layer, the second capacitive plate being configured and arranged as a first floating node of the isolation circuit, the second horizontal size differing from the horizontal size of the first capacitive plate such that a breakdown voltage between the first and second capacitive plates is increased relative to a breakdown voltage for a common horizontal size for the first and second capacitive plates;
a second capacitive structure located on the second substrate and including,
a third capacitive plate that is configured and arranged as a second floating node and having a third horizontal size, and
a fourth capacitive plate having a fourth horizontal size, the fourth capacitive plate being parallel to and separated from the third capacitive plate by a second dielectric layer, the fourth capacitive plate configured and arranged to provide the communication signals to the input of the receiver in the second voltage domain, the fourth horizontal size differing from the third horizontal size such that breakdown voltage between the third and fourth capacitive plates is increased relative to a common horizontal size for the third and fourth capacitive plates; and
an electrical connection between the second and third capacitive plates.

2. The device of claim 1, wherein:
the second capacitive plate is further from the first substrate than the first capacitive plate; and
the third capacitive plate is further from the second substrate than the fourth capacitive plate.

3. The device of claim 1, wherein:
the difference between the first and second horizontal sizes is such that breakdown voltage between the first and second capacitive plates is increased by at least 5% relative to a common horizontal size for the first and second capacitive plates; and the difference between the third and fourth horizontal sizes is such that breakdown voltage between the first and second capacitive plates is increased by at least 5% relative to the common horizontal size for the first and second capacitive plates.

4. The device of claim 1, wherein the first and second capacitive plate are centered on a common horizontal position and the third and fourth capacitive plates are centered on another common horizontal position.

5. The device of claim 1, wherein the capacitive plates of the first and second capacitive structures are separated from the first and second substrates by respective third and fourth dielectric layers.

6. The device of claim 1, wherein the electrical connection is a bond wire that contacts the second and third capacitive plates.

7. The device of claim 1, wherein at least one of the first and second substrates is a silicon-on-insulator (SOI) substrate.

8. The device of claim 7, wherein the SOI substrate includes a handle wafer, a silicon layer, and a buried oxide layer providing isolation between the handle wafer and the silicon layer.

9. The device of claim 1, wherein the first and second capacitive plates are centered on different horizontal positions relative to each other and the third and fourth capacitive plates are centered on different horizontal positions relative to each other.

10. The device of claim 1, wherein each of the first, second, third, and fourth capacitive plates are each configured as polygon-shaped plates, in a horizontal direction and with respective corners that are sufficiently rounded to reduce capacitive breakdown voltages.

11. The device of claim 1, wherein at least one of the first, second, third, and fourth capacitive plates have edges that are vertically rounded.

12. The device of claim 1, wherein the first capacitive structure includes a guard ring laterally partly circumscribing the first and second capacitive plates.

13. The device of claim 12, wherein the guard ring is vertically located between the first and second capacitive plates.

14. The device of claim 1, wherein one of the first and second capacitive structures includes an electrical connection from one of the transmitter and receiver to the one of the capacitive plates that is located closer to the corresponding substrate.

15. The device of claim 14, where the electrical connection includes a polysilicon portion.

16. The device of claim 14, wherein part of the electrical connection is located in a layer between the corresponding substrate and the one of the capacitive plates that is located closer to the corresponding substrate.

17. The device of claim 14, wherein each of the first and second substrates is a silicon on insulator (SOI) substrate having a respective and corresponding handle wafer, a silicon layer and a buried oxide layer providing isolation between the handle wafer and the silicon layer, and wherein the electrical connection includes a first electrical connection between a portion of the silicon layer and the one of the capacitive plates that is located closer to the corresponding substrate and a second electrical connection between the silicon layer and the transmitter or receiver .

18. The device of claim 17, wherein first electrical connection is a vertical connection, the second electrical connection includes a vertical connection between the silicon portion and an electrical path to the transmitter or receiver.

19. A device, comprising:
a first communication circuit configured and arranged to operate in a first voltage domain
a second communication circuit configured and arranged to operate in a second voltage domain; and
an isolation circuit configured and arranged to provide capacitive isolation for signals communicated between the first and the second communication circuits, the isolation circuit including:
a capacitive structure located on a substrate and including,
a first capacitive plate having a horizontal size and configured and arranged to receive the signals from the first communication circuit and in the first voltage domain, and
a second capacitive plate having a second horizontal size, parallel to and separated from the first capacitive plate by a dielectric layer, the second capacitive plate being configured and arranged to provide the signals to the second communication circuit in the second voltage domain, the second horizontal size differing from the horizontal size of the first capacitive plate such that a breakdown voltage between the first and second capacitive plates is increased relative to a common horizontal size for the first and second capacitive plates.

20. The device of claim 19, wherein the first communication circuit and the second communication circuit, are located on the substrate.

* * * * *